United States Patent
Kim

(10) Patent No.: US 12,320,729 B2
(45) Date of Patent: Jun. 3, 2025

(54) BATTERY PACK, BATTERY APPARATUS AND METHOD FOR DETECTING ELECTROLYTE LEAKAGE

(71) Applicant: LG Energy Solution, Ltd., Seoul (KR)

(72) Inventor: Dong Hyeon Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 155 days.

(21) Appl. No.: 17/913,519

(22) PCT Filed: Dec. 23, 2021

(86) PCT No.: PCT/KR2021/019685
§ 371 (c)(1),
(2) Date: Sep. 22, 2022

(87) PCT Pub. No.: WO2022/164040
PCT Pub. Date: Aug. 4, 2022

(65) Prior Publication Data
US 2023/0103765 A1    Apr. 6, 2023

(30) Foreign Application Priority Data
Jan. 29, 2021 (KR) .................. 10-2021-0013132

(51) Int. Cl.
*H01M 10/42* (2006.01)
*G01M 3/18* (2006.01)

(52) U.S. Cl.
CPC ....... *G01M 3/186* (2013.01); *H01M 10/4228* (2013.01); *H01M 10/425* (2013.01); *H01M 2010/4271* (2013.01)

(58) Field of Classification Search
CPC ............. G01M 3/186; H01M 10/4228; H01M 10/425; H01M 2010/4271; H01M 50/204;
(Continued)

(56) References Cited

U.S. PATENT DOCUMENTS 4,881,057 A    11/1989 Garcia et al.
5,824,883 A    10/1998 Park et al.
(Continued)

FOREIGN PATENT DOCUMENTS

CN    202710276 U    1/2013
CN    110873630 A    3/2020
(Continued)

OTHER PUBLICATIONS

International Search Report for Application No. PCT/KR2021/019685 mailed Apr. 6, 2022, pp. 1-4.
(Continued)

*Primary Examiner* — Robert R Raevis
(74) *Attorney, Agent, or Firm* — Lerner David LLP

(57) ABSTRACT

In a battery pack, a battery monitoring circuit is connected to a battery module including a plurality of battery cells to monitor the battery module. The detection sensor detects an electrolyte leaking in the battery module, and includes a first resistor and a second resistor connected in series between a power supply supplying a first voltage and a ground terminal, and a variable resistor connected to the first resistor in parallel and having a resistance that varies depending on the electrolyte leaking in the battery module. The detection sensor transfers, as a sensing voltage, a voltage at a contact between the first resistor and the second resistor to an input terminal of the battery monitoring circuit.

19 Claims, 5 Drawing Sheets

(58) Field of Classification Search
CPC ............... H01M 10/48; H01M 6/5083; H01M 10/4285; B60L 2250/16; B60L 3/0046; B60L 3/04; B60L 50/64; B60L 58/16; B60L 2240/547; Y02E 60/10; G01R 31/392; G01R 19/16542; G01R 19/16566; G01R 31/389; G01R 31/396; H02J 7/0029; H02J 7/0047; H02H 7/18
USPC ............. 73/40–40.7, 49.2, 49.3, 49.7, 865.9; 324/426, 432–434, 691, 693, 713–718, 324/722–724; 136/290
See application file for complete search history.

(56) References Cited

U.S. PATENT DOCUMENTS

| | | | |
|---|---|---|---|
| 6,337,559 | B1 | 1/2002 | Sato |
| 2006/0076930 | A1 | 4/2006 | Ooshita et al. |
| 2007/0190403 | A1 | 8/2007 | Wang |
| 2011/0163723 | A1 | 7/2011 | Tan et al. |
| 2012/0121942 | A1* | 5/2012 | Kim .................. H01M 10/44 429/7 |
| 2013/0183552 | A1* | 7/2013 | Yang .................. H01M 50/24 429/61 |
| 2017/0250545 | A1 | 8/2017 | Kudo et al. |
| 2018/0062210 | A1 | 3/2018 | Kim |
| 2018/0287224 | A1 | 10/2018 | Ryoo et al. |
| 2019/0146040 | A1 | 5/2019 | Murakami et al. |
| 2019/0252735 | A1 | 8/2019 | Sung et al. |
| 2020/0067145 | A1* | 2/2020 | Yamashima .......... G01M 3/186 |
| 2021/0184270 | A1 | 6/2021 | Sung et al. |

FOREIGN PATENT DOCUMENTS

| | | | |
|---|---|---|---|
| CN | 111624516 | A | 9/2020 |
| CN | 111751742 | A | 10/2020 |
| EP | 2770606 | B1 | 4/2019 |
| JP | S58164093 | U | 11/1983 |
| JP | H01102331 | A | 4/1989 |
| JP | H03012144 | U | 2/1991 |
| JP | H03124201 | A | 5/1991 |
| JP | H10012284 | A | 1/1998 |
| JP | H10115569 | A | 5/1998 |
| JP | 2001084996 | A | 3/2001 |
| JP | 2002251985 | A | 9/2002 |
| JP | 2005228659 | A | 8/2005 |
| JP | 2005293881 | A * | 10/2005 |
| JP | 2006101635 | A | 4/2006 |
| JP | 3877509 | B2 | 2/2007 |
| JP | 4512942 | B2 | 7/2010 |
| JP | 4810745 | B2 | 11/2011 |
| KR | 20070109083 | A | 11/2007 |
| KR | 20110053004 | A | 5/2011 |
| KR | 101383599 | B1 | 4/2014 |
| KR | 20180024545 | A | 3/2018 |
| KR | 20180111314 | A | 10/2018 |
| KR | 102137759 | B1 | 7/2020 |

OTHER PUBLICATIONS

Extended European Search Report including Written Opinion for Application No. 21923446.5 dated Jun. 27, 24, pp. 1-13.
Communication pursuant to Article 94(3) EPC for European Application No. 21923446.5 dated Mar. 21, 2025. 8 pages.

* cited by examiner

BATTERY PACK, BATTERY APPARATUS AND METHOD FOR DETECTING ELECTROLYTE LEAKAGE

CROSS-REFERENCE TO RELATED APPLICATIONS

The present application is a national phase entry under 35 U.S.C. § 371 of International Application No. PCT/KR2021/019685 filed Dec. 23, 2021, which claims priority from Korean Patent Application No. 10-2021-0013132 filed Jan. 29, 2021, all of which are incorporated herein by reference.

TECHNICAL FIELD

The technology described relates to a battery pack, a battery apparatus, and a method for detecting electrolyte leakage.

BACKGROUND ART

An electric vehicle or a hybrid vehicle is a vehicle that obtains power by driving a motor mainly using a battery as a power supply. The electric vehicles are being actively researched because they are alternatives that can solve pollution and energy problems of internal combustion vehicles. Rechargeable batteries are used in various external apparatuses other than the electric vehicles.

The battery is provided in a form of a battery pack including a battery module in which a plurality of battery cells are connected. A lower case of the battery pack has a structure connected to an external apparatus, for example, a chassis of a vehicle. In this case, when an electrolyte leaks from the battery cell of the battery pack, a path in which the battery cell and the lower case of the battery pack are connected may occur by the electrolyte leakage so that insulation can be broken. Insulation breakdown can cause a fire in a battery pack or destroy low-voltage components in the vehicle. Therefore, it is necessary to detect the electrolyte leakage inside the battery pack.

SUMMARY

Technical Problem

Some embodiments may provide a battery pack, a battery apparatus, and a method for detecting electrolyte leakage, capable of detecting electrolyte leakage inside the battery pack.

Technical Solution

According to an embodiment, there may be provided a battery pack including a battery module including a plurality of battery cells, a battery monitoring circuit, and a detection sensor configured to detect an electrolyte leaking in the battery module. The battery monitoring circuit may be connected to the battery module, and may monitor the battery module. The detection sensor may include a first resistor and a second resistor connected in series between a power supply supplying a first voltage and a ground terminal, and a variable resistor connected to the first resistor in parallel and having a resistance that varies depending on the electrolyte leaking in the battery module. The detection sensor may be configured to transfer a sensing voltage to an input terminal of the battery monitoring circuit, the sensing voltage indicating a voltage at a node between the first resistor and the second resistor.

In some embodiments, the battery monitoring circuit may monitor the battery module while the battery monitoring circuit is in an active mode.

In some embodiments, the battery pack may include a pulse generator configured to generate a pulse signal for switching the battery monitoring circuit to the active mode and output the pulse signal to an output terminal in response to the sensing voltage being higher than a threshold voltage, and a transfer circuit configured to transfer the pulse signal to a receive terminal of the battery monitoring circuit while the battery monitoring circuit is in a shutdown mode and block the pulse signal from being transferred to the receive terminal of the battery monitoring circuit while the battery monitoring circuit is in the active mode.

In some embodiments, the transfer circuit may include a transistor connected between the output terminal of the pulse generator and a ground terminal. The transistor may be configured to turn on in response to a second voltage being supplied to a power terminal of the battery monitoring circuit while the battery monitoring circuit is in the active mode. The transistor may be configured to turn off in response to the second voltage being blocked from the power terminal of the battery monitoring circuit while the battery monitoring circuit is in the shutdown mode.

In some embodiments, the transfer circuit may further include a diode connected between a first terminal of the transistor and the receive terminal of the battery monitoring circuit, and a second terminal of the transistor may be connected to the ground terminal.

In some embodiments, the transfer circuit may further include a third resistor connected between the output terminal of the pulse generator and the first terminal of the transistor.

In some embodiments, the battery pack may further include a voltage regulator configured to generate the first voltage from a voltage of the battery module.

In some embodiments, electrolyte leakage in the battery module may be diagnosed in response to the sensing voltage being higher than a reference voltage.

In some embodiments, the battery pack may further include a lower case of the battery pack, and a lower cover formed on the lower case and under the battery module and configured to collect the electrolyte leaking in the battery module. The detection sensor may be attached to the lower cover.

According to another embodiment, a battery apparatus including a battery module including a plurality of battery cells, a battery monitoring circuit, a detection sensor configured to detect an electrolyte leaking in the battery module, and a battery management system may be provided. The battery monitoring circuit may be connected to the battery module and monitor the battery module. The battery management system may manage the battery monitoring circuit, and may receive information from the battery monitoring circuit to diagnose electrolyte leakage. The detection sensor may include a variable resistor having a resistance that varies depending on the electrolyte leaking in the battery module, and may transfer a sensing voltage to an input terminal of the battery monitoring circuit, the sensing voltage being determined based on the resistance of the variable resistor.

In some embodiments, the battery management system may diagnose that the electrolyte leaks in the battery module in response to determining that the sensing voltage is higher than a reference voltage based on the information transferred from the battery monitoring circuit.

In some embodiments, the detection sensor may further include a first resistor and a second resistor connected in series between a power supply for supplying a first voltage and a ground terminal. In this case, the variable resistor may be connected to the first resistor in parallel, and the sensing voltage may be indicative of a voltage at a node between the first resistor and the second resistor.

In some embodiments, the battery apparatus may further include a pulse generator configured to transfer a pulse signal to a receive terminal of the battery monitoring circuit in response to the detection sensor detecting the electrolyte leaking in the battery module while the battery monitoring circuit is in a shutdown mode. The battery monitoring circuit may switch to an active mode in response to the pulse signal.

In some embodiments, the pulse generator may generate the pulse signal in response to the sensing voltage being higher than a threshold voltage.

In some embodiments, the battery apparatus may further include a transistor connected between an output terminal of the pulse generator and the ground terminal, and configured to control transfer of the pulse signal to the receive terminal of the battery monitoring circuit in response to a voltage supplied to a power terminal of the battery monitoring circuit.

In some embodiments, the second voltage may be supplied to the power terminal of the battery monitoring circuit while the battery monitoring circuit is in the active mode, and the second voltage may be blocked from the power terminal of the battery monitoring circuit while the battery monitoring circuit is in the shutdown mode. While the battery monitoring circuit is in the active mode, the transistor may be configured to turn on to block the pulse signal from being supplied to the power terminal in response to the second voltage. While the battery monitoring circuit is in the shutdown mode, the transistor may be configured to turn off to transfer the pulse signal in response to the blocked second voltage.

In some embodiments, the battery apparatus may further include a lower cover formed under the battery module, configured to collect the electrolyte leaking in the battery module, and to which the detection sensor is attached.

According to yet another embodiment, there may be provided a method of detecting electrolyte leakage in a battery apparatus including a battery module, a battery monitoring circuit configured to monitor the battery module, and an electrolyte leakage detection sensor. The method may include generating, by a pulse generator, a pulse signal in response to an electrolyte leaking in the battery module while the battery monitoring circuit is in a shutdown mode, switching, by the battery monitoring circuit, to an active mode in response to the pulse signal, measuring, by the electrolyte leakage detection sensor, a sensing voltage of the electrolyte leakage detection sensor in the battery monitoring circuit while the battery monitoring circuit is in the active mode, and diagnosing, by a battery management system connected to the battery pack, the electrolyte leakage in response to the sensing voltage being higher than a reference voltage.

In some embodiments, the method may further include measuring, by the electrolyte leakage detection sensor, the sensing voltage based on a resistance that varies depending on the electrolyte leaking in the battery module.

Advantageous Effects

According to some embodiments, electrolyte leakage can be detected even in a shutdown mode of a battery monitoring circuit.

DETAILED DESCRIPTION

Figure 1:
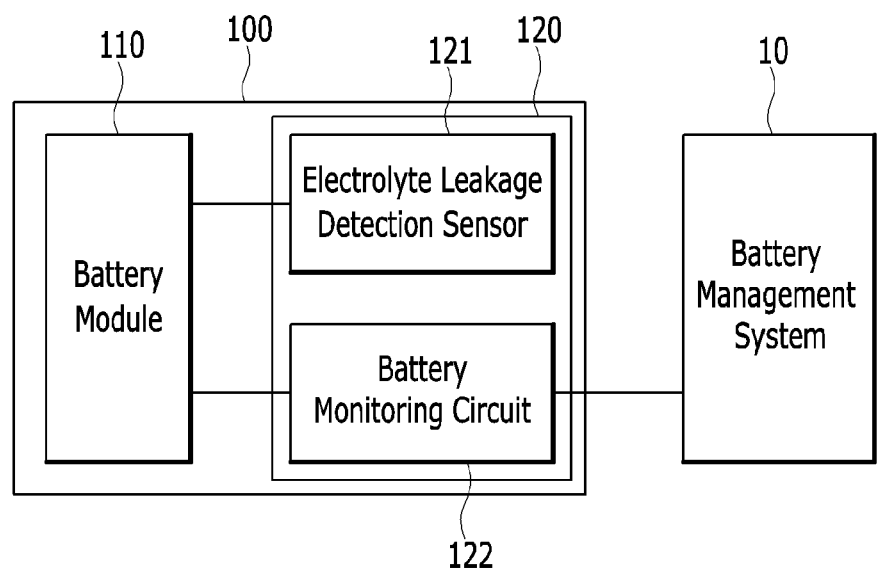
FIG. 1 is a diagram showing a battery apparatus according to some embodiments.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

Figure 2:
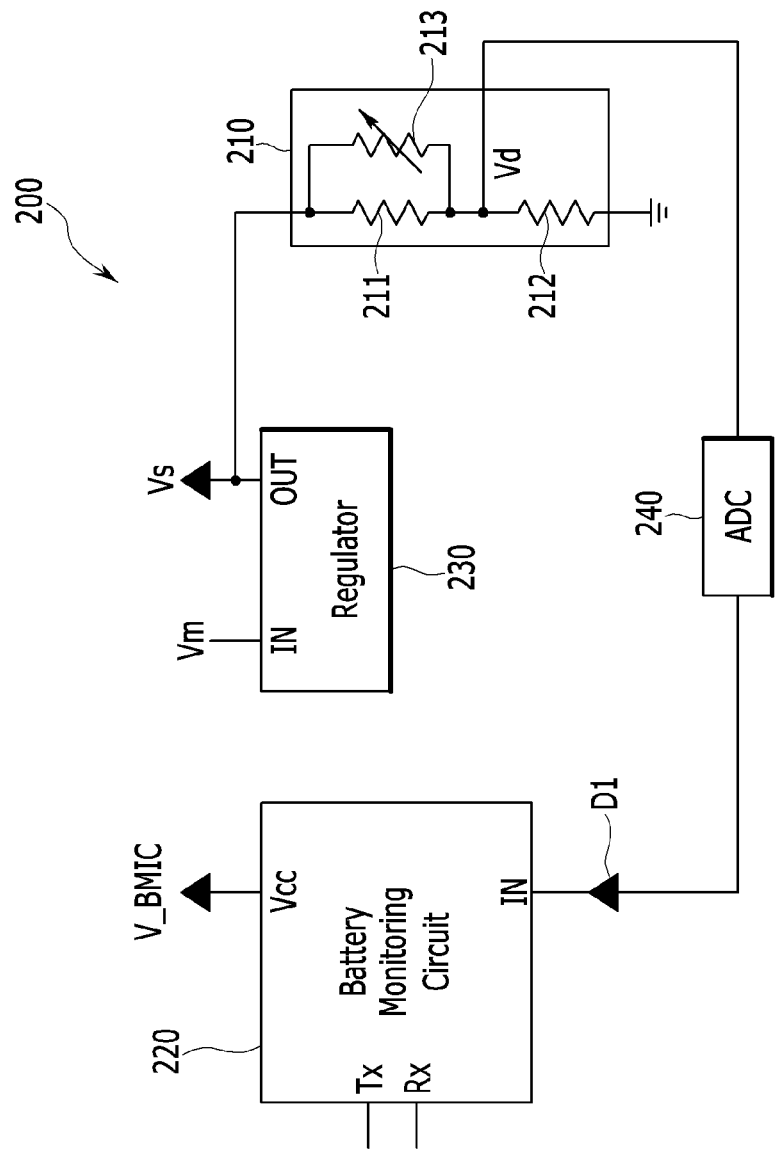
FIG. 2 is a diagram showing an electrolyte leakage detecting apparatus according to some embodiments.

FIG. 1 is a diagram showing a battery apparatus according to some embodiments, and FIG. 2 is a diagram showing an electrolyte leakage detecting apparatus according to some embodiments.

Referring to FIG. 1, a battery apparatus includes a battery pack 100 and a battery management system 10. The battery pack 100 includes a battery module 110 and an electrolyte leakage detection circuit 120.

The battery module 110 includes a plurality of battery cells (not shown). In some embodiments, a battery cell may be a rechargeable battery, and may include a positive electrode, a negative electrode, and an electrolyte. In some embodiments, a predetermined number of battery cells may be connected in series or parallel to form a battery module. Although FIG. 1 shows one battery module 110 for convenience of description, the battery pack 100 may include one or more battery modules 110 in order to supply desired power.

The electrolyte leakage detection circuit 120 includes an electrolyte leakage detection sensor 121 and a battery monitoring circuit 122.

The electrolyte leakage detection sensor 121 may be connected to the battery module 110, detect electrolyte leakage in the battery cells included in the battery module 110, and transmit a signal to the battery monitoring circuit 122 when detecting electrolyte leakage.

The battery monitoring circuit 122 is connected to the battery module 110 and monitors voltages of the battery cells. In some embodiments, the battery monitoring circuit 122 may measure a temperature of the battery module 110. In some embodiments, the battery monitoring circuit 122 may be provided in the form of an integrated circuit (IC). When receiving a signal from the electrolyte leakage detection sensor 121, the battery monitoring circuit 122 transmits corresponding information to an external apparatus (e.g., vehicle).

The battery monitoring circuit 122 may communicate with the battery management system 10 of the battery apparatus. The battery management system 10 may collect data (information) transmitted from the battery monitoring circuit 122 to control an operation of the battery pack 100. Further, the battery management system 10 may transmit information collected from the battery monitoring circuit 122 to the external apparatus (e.g., vehicle).

Referring to FIG. 2, an electrolyte leakage detection device 200 includes an electrolyte leakage detection sensor 210 and a battery monitoring circuit 220. In some embodiments, the electrolyte leakage detection device 200 may correspond to the electrolyte leakage detection circuit 120 of FIG. 1.

The electrolyte leakage detection sensor 210 includes a plurality of resistors 211 and 212 connected in series between a power supply supplying a predetermined voltage Vs and a ground terminal, and outputs a voltage at a contact between the resistors 211 and 212 as a sensing voltage Vd. The electrolyte leakage detection sensor 210 further includes a variable resistor 213 connected in parallel to the resistor 211. In some embodiments, the variable resistor 213 may be connected (i.e., attached) to a battery module (e.g., 110 in FIG. 1), may not form a current path when the electrolyte is not leaked in the battery cell, and may form the current path when the electrolyte is leaked in the battery cell.

In some embodiments, a resistance of the resistor 211 may be set high in order to set a magnitude of current in the electrolyte leakage detection sensor 210 low. For example, a 1 MΩ resistor may be used as the resistor 211. Further, the resistance of the resistor 212 may be determined based on a resistance of the variable resistor 213 caused by the leaked electrolyte. For example, when the variable resistor 213 caused by the leaked electrolyte is several tens of kΩ, a 43 kΩ resistor may be used as the resistor 212.

In some embodiments, the power source supplying the predetermined voltage Vs may be generated from a voltage of the battery module (e.g., 110 in FIG. 1). To this end, the electrolyte leakage detection apparatus 200 may further include a voltage regulator 230. The voltage regulator 230 may receive a voltage Vm of the battery module 110 through an input terminal IN and output the predetermined voltage Vs through an output terminal OUT. The predetermined voltage Vs may be, for example, 5V.

It is assumed that the resistance of the resistor 211 is R1, the resistance of the resistor 212 is R2, and the resistance of the variable resistor 213 when the electrolyte is leaked is R3. When the electrolyte is not leaked from the battery module 110, the electrolyte leakage detection sensor 210 may output, as the sensing voltage Vd, a voltage (Vs*R2/(R1+R2)) into which the voltage Vs is divided by the resistors 211 and 212. When the electrolyte is leaked from the battery module 110, the electrolyte leakage detection sensor 210 may output, as the sensing voltage Vd, a voltage (Vs*R2/(Rt+R2)) into which the voltage Vs is divided by a resistor (Rt=R1*R3/(R1+R3)) combined by parallel connection of the resistor 211 and the variable resistor 213, and the resistor 212. Accordingly, the sensing voltage Vd when the electrolyte is leaked is higher than the sensing voltage Vd when the electrolyte is not leaked. In some embodiments, when the resistance of the resistor 211 is set to be significantly higher than the resistance of the resistor 212, the sensing voltage Vd when the electrolyte is not leaked may be a voltage close to 0V. For example, when the voltage Vs of the power supply is 5V and a 1 MΩ resistor and a 43 kΩ resistor are used as the two resistors 211 and 212, respectively, the sensing voltage Vd when the electrolyte is not leaked may be approximately 0.2V. On the other hand, when the voltage Vs of the power supply is 5V, the 1 MΩ resistor and the 43 kΩ resistor are used as the two resistors 211 and 212, respectively, and the resistance of the variable resistor 213 when the electrolyte is leaked is 43 kΩ the sensing voltage Vd may be approximately 2.5V.

The battery monitoring circuit 220 receives a signal corresponding to the sensing voltage Vd of the electrolyte leakage detection sensor 210 through the input terminal IN (e.g., an input pin). In some embodiments, the input terminal IN may be one of various input terminals that are provided to receive a monitoring result from the battery monitoring circuit 220. In some embodiments, the electrolyte leakage detection device 200 may further include an analog to digital converter (ADC) that converts the sensing voltage Vd of the electrolyte leakage detection sensor 210 into a digital signal that can be received by the battery monitoring circuit 220. In some embodiments, the electrolyte leakage detection device 200 may further include a diode D1 that blocks a current path in an opposite direction, that is, a current path from the input terminal IN of the battery monitoring circuit 220 to an output terminal of the electrolyte leakage detection sensor 210. The diode D1 may have an anode connected to the output terminal of the electrolyte leakage detection sensor 210 and a cathode connected to the input terminal IN of the battery monitoring circuit 220.

The battery monitoring circuit 220 may operate by a predetermined voltage V_BMIC supplied to a power terminal Vcc (e.g., a power pin). In some embodiments, the predetermined voltage V_BMIC may be the same voltage as the power supply voltage Vs of the electrolyte leakage detection sensor 210. In addition, the battery monitoring circuit 220 may communicate with a battery management system (e.g., 10 in FIG. 1) through a transmit terminal Tx (e.g., a transmission pin) and a receive terminal Rx (e.g., a reception pin). The battery monitoring circuit 220 may transmit the monitored data to the battery management system 10 through a transmission communication line connected between the transmit terminal Tx and the battery management system 10. The battery monitoring circuit 220 may receive a control signal from the battery management system 10 through a reception communication line connected between the receive terminal Rx and the battery management system 10. In some embodiments, the communication between the battery monitoring circuit 220 and the battery management system 10 may be a universal asynchronous receiver/transmitter (UART) communication.

The battery monitoring circuit 220 transfers information corresponding to the sensing voltage Vd of the electrolyte leakage detection sensor 210 received through the input terminal IN to, for example, the battery management system 10. As described above, when the electrolyte is not leaked, the sensing voltage Vd of the electrolyte leakage detection sensor 210 is a low voltage (a voltage close to 0V). Accordingly, the battery management system 10 or a processor of the external apparatus (e.g., the vehicle) may determine that there is no electrolyte leakage when the sensing voltage Vd of the electrolyte leakage detection sensor 210 is lower than the reference voltage.

On the other hand, when the electrolyte is leaked, the sensing voltage Vd of the electrolyte leakage detection sensor 210 is a significant voltage (e.g., a voltage of 2.5V or more). Accordingly, the battery management system 10 or the processor of the external apparatus may determine that there is the electrolyte leakage when the sensing voltage Vd of the electrolyte leakage detection sensor 210 is higher than the reference voltage. As such, the battery management system 10 or the external apparatus may detect the electrolyte leakage in the battery pack through the output signal of the battery monitoring circuit 220 and perform a protection operation. In some embodiments, when the sensing voltage Vd is higher than the reference voltage, the battery management system 10 may transmit a warning signal to an external apparatus (e.g., vehicle). Accordingly, a driver of the vehicle may perform an inspection of the battery pack.

Figure 3:
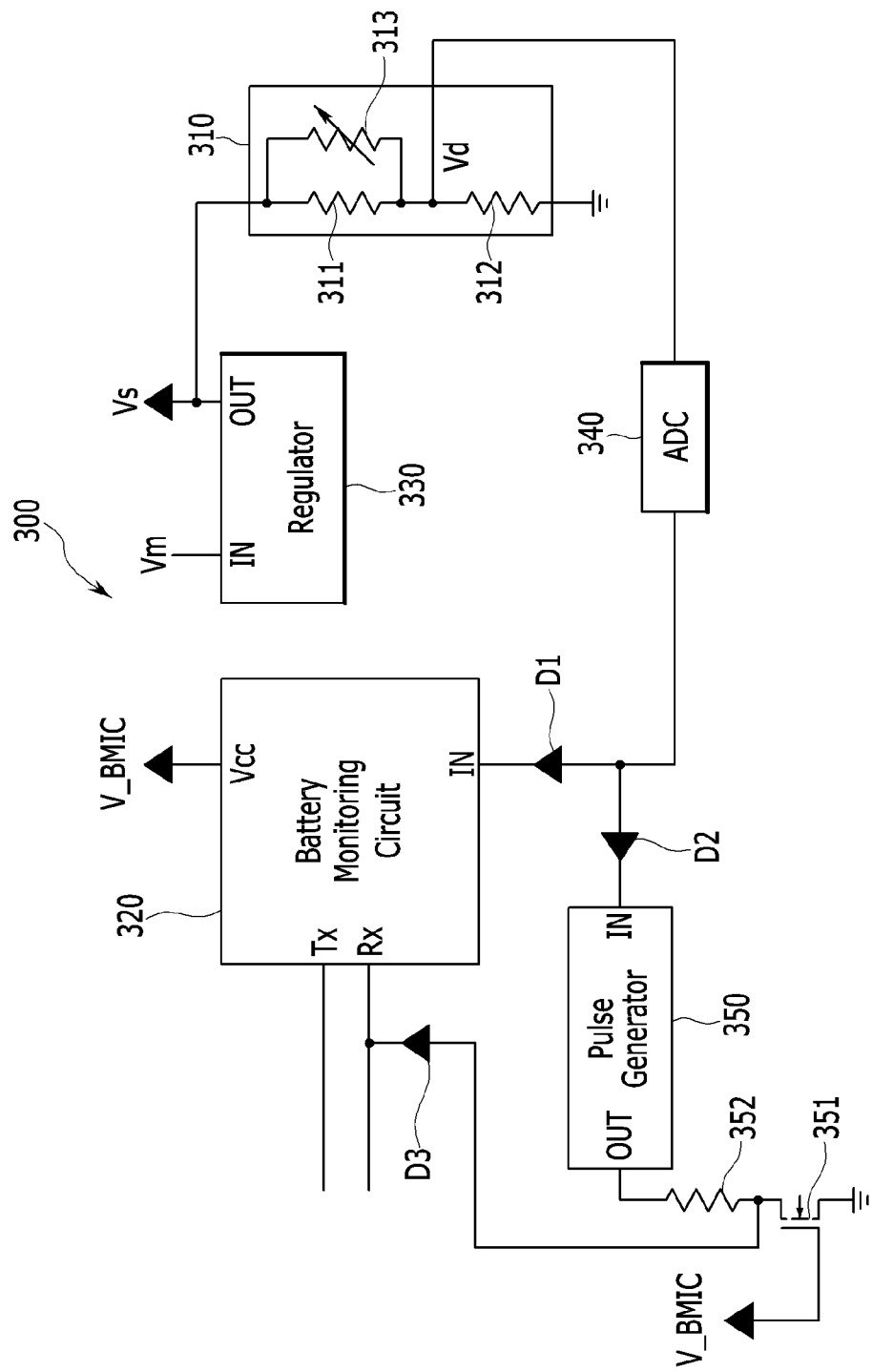
FIG. 3 is a diagram showing an electrolyte leakage detection device according to some embodiments.

FIG. 3 is a diagram showing an electrolyte leakage detection device according to some embodiments.

Referring to FIG. 3, an electrolyte leakage detection device 300 includes an electrolyte leakage detection sensor 310 and a battery monitoring circuit 320. In some embodiments, the electrolyte leakage detection device 300 may correspond to the electrolyte leakage detection circuit 120 of FIG. 1.

The electrolyte leakage detection sensor 310 includes a plurality of resistors 311 and 312 connected in series between a power supply supplying a predetermined voltage Vs and a ground terminal, and outputs a voltage at a contact between the resistors 311 and 312 as a sensing voltage Vd. The electrolyte leakage detection sensor 310 further includes a variable resistor 313 connected in parallel to the resistor 311. In some embodiments, the electrolyte leakage detecting apparatus 300 may further include a voltage regulator 330 that generates the predetermined voltage Vs.

The battery monitoring circuit 320 receives a signal corresponding to the sensing voltage Vd of the electrolyte leakage detection sensor 310. In some embodiments, the electrolyte leakage detection device 300 may further includes an ADC 340 that converts the sensing voltage Vd of the electrolyte leakage detection sensor 310 into a digital signal that can be received by the battery monitoring circuit 320. In some embodiments, the electrolyte leakage detection device 300 may further include a diode D1 that blocks a current path in an opposite direction.

In some embodiments, the battery monitoring circuit 320 may enter in one of an active mode that monitors a battery module (e.g., 110 in FIG. 1) and a shutdown mode that does not monitor the battery module 110. In the active mode, a predetermined voltage V_BMIC is supplied to a power terminal Vcc (e.g., a power pin) of the battery monitoring circuit 320 to operate the battery monitoring circuit 320. In the shutdown mode, the predetermined voltage V_BMIC supplied to the power terminal Vcc of the battery monitoring circuit 320 is blocked so that the battery monitoring circuit 320 may not operate. In some embodiments, the predetermined voltage V_BMIC may be the same as the predetermined voltage Vs supplied to the electrolyte leakage detection sensor 310. In some embodiments, the electrolyte leakage detection apparatus 300 may further include a pulse generator 350 to detect the electrolyte leakage even when the battery monitoring circuit 320 is in the shutdown mode.

The sensing voltage Vd of the electrolyte leakage detection sensor 310 is supplied to an input terminal IN of the pulse generator 350. In some embodiments, a signal into which the ADC 340 converts the sensing voltage Vd of the electrolyte leakage detection sensor 310 may be input to the input terminal IN of the pulse generator 350. In some embodiments, the electrolyte leakage detection device 300 includes a diode D2 that blocks a current path in an opposite direction, that is, a current path from the input terminal IN of the pulse generator 350 to the electrolyte leakage detection sensor 310. The diode D2 may have an anode connected to the output terminal of the electrolyte leakage detection sensor 210 and a cathode connected to the input terminal IN of the pulse generator 350.

A transistor 351 is connected between an output terminal OUT of the pulse generator 350 and the ground terminal. That is, a first terminal of the transistor 351 is connected to the output terminal OUT of the pulse generator 350, and the second terminal of the transistor 351 is connected to the ground terminal. Further, a control terminal of the transistor 351 receives the same voltage as the power terminal Vcc of the battery monitoring circuit 320. For example, the control terminal of the transistor 351 may be connected to the power terminal Vcc of the battery monitoring circuit 320. Furthermore, the first terminal of the transistor 351 is connected to a receive terminal Rx (e.g., a reception pin) of the battery monitoring circuit 320. In some embodiments, the first terminal of the transistor 351 may be connected to a receiving communication line between the receiving terminal Rx of the battery monitoring circuit 320 and the battery management system (e.g., 10 in FIG. 1). In some embodiments, the electrolyte leakage detection device 300 may further include a diode D3 that blocks a current path in an opposite direction, that is, a current path from the reception communication line to the first terminal of the transistor 351. can The diode D3 may have an anode connected to the first terminal of the transistor 351 and a cathode connected to the receive terminal Rx of the battery monitoring circuit 320. In some embodiments, a resistor 352 may be connected between the output terminal OUT of the pulse generator 350 and the first terminal of the transistor 351.

The transistor 351 may be turned on when the predetermined voltage (e.g., V_BMIC) is applied to the power terminal Vcc of the battery monitoring circuit 320, and may be turned off when the voltage applied to the power terminal Vcc of the battery monitoring circuit 320 is blocked. In some embodiments, the transistor 351 may be an n-channel transistor, for example, an n-channel metal oxide semiconductor field effect transistor (MOSFET). In this case, the first terminal, the second terminal, and the control terminal of the transistor 351 may be a drain, a source, and a gate, respectively.

In the active mode, the electrolyte leakage detection sensor 310 and the battery monitoring circuit 320 operate the same as the electrolyte leakage detection sensor 210 and the battery monitoring circuit 220 described with reference to FIG. 2. The description thereof is omitted. Meanwhile, since the predetermined voltage V_BMIC is applied to the power terminal Vcc of the battery monitoring circuit 320 in the active mode, the transistor 351 is turned on. Accordingly, 0V is applied to the anode of the diode D3 so that communication through the receive terminal Rx of the battery monitoring circuit 320 may not be affected.

In the shutdown mode, since the voltage applied to the power terminal Vcc of the battery monitoring circuit 320 is blocked, the transistor 351 is turned off. In addition, when the electrolyte is leaked, a significant sensing voltage Vd is output from the electrolyte leakage detection sensor 310. Accordingly, the pulse generator 350 may generate a pulse signal and output the pulse signal to the output terminal OUT, in response to the sensing voltage Vd of the electrolyte leakage detection sensor 310. That is, when the voltage input to the input terminal IN is higher than a threshold voltage, the pulse generator 350 may generate the pulse signal and output it to the output terminal OUT. In this case, since the transistor 351 is turned off, the pulse signal of the pulse generator 350 may be applied to the receive terminal Rx of the battery monitoring circuit 320. The battery monitoring circuit 320 may switch to the active mode in response to the pulse signal transmitted to the receive terminal Rx. Then, the battery monitoring circuit 320 may transmit information corresponding to the sensing voltage Vd of the electrolyte leakage detection sensor 310 to the battery management system 10.

In some embodiments, the transistor 351, the resistor 352, and the diode D3 may operate as a transfer circuit that transfers the pulse signal of the pulse generator 350 to the receive terminal Rx of battery monitoring circuit 320 in the shutdown mode and blocks the transfer of the pulse signal in the active mode.

According to the above-described embodiments, the electrolyte leakage can be detected even when the battery monitoring circuit 320 is in the shutdown mode.

Figure 4:
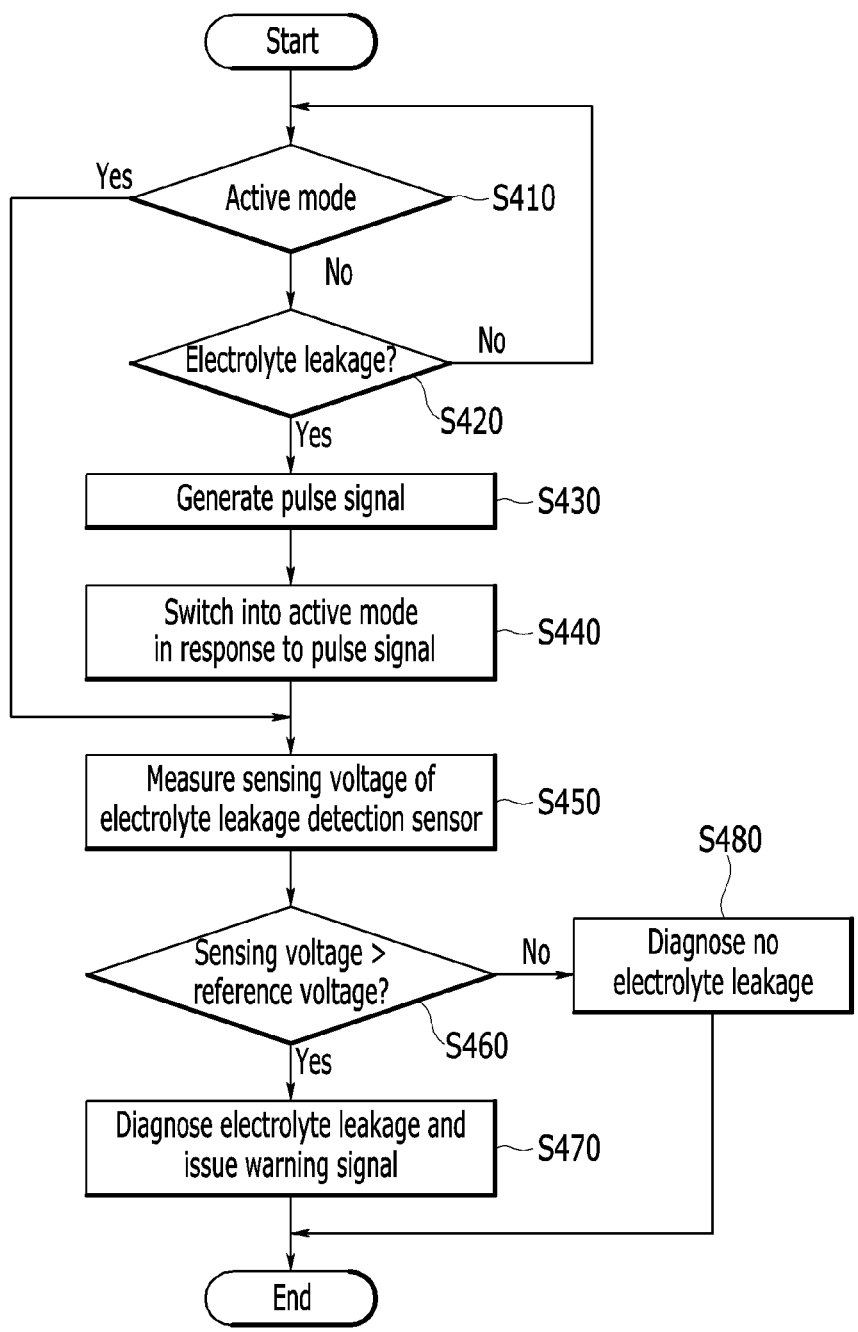
FIG. 4 is a flowchart showing a method for detecting electrolyte leakage in the battery apparatus according to some embodiments.

FIG. 4 is a flowchart showing a method for detecting electrolyte leakage in the battery apparatus according to some embodiments.

Referring to FIG. 4, when a battery monitoring circuit of a battery pack is in an active mode at S410, a battery monitoring circuit measures a voltage corresponding to electrolyte leakage at S450. In some embodiments, the battery monitoring circuit may measure a sensing voltage output from the electrolyte leakage detection sensor at S450.

In a case where the electrolyte leakage occurs inside the battery pack at S420 when the battery monitoring circuit of the battery pack is in a shutdown mode, the battery apparatus generates a pulse signal in response to the electrolyte leakage at S430. The battery monitoring circuit switches to the active mode in response to the pulse signal at S440, and measures a voltage corresponding to the electrolyte leakage at S450. In some embodiments, a pulse generator may generate the pulse signal in response to a sensing voltage corresponding to the electrolyte leakage output from the electrolyte leakage detection sensor, and the battery monitoring circuit may switch to the active mode in response to the pulse signal of the pulse generator.

When the voltage measured by the battery monitoring circuit is higher than a reference voltage at S460, the battery apparatus may diagnose the electrolyte leakage and transmit a warning signal to an external apparatus (e.g., a vehicle) at S470. When the measured voltage is not higher than the reference voltage, the battery device may diagnose that there is no electrolyte leakage at S480.

Next, a battery pack to which an electrolyte leakage detection method according to various embodiments is applied is described with reference to FIG. 5.

Figure 5:
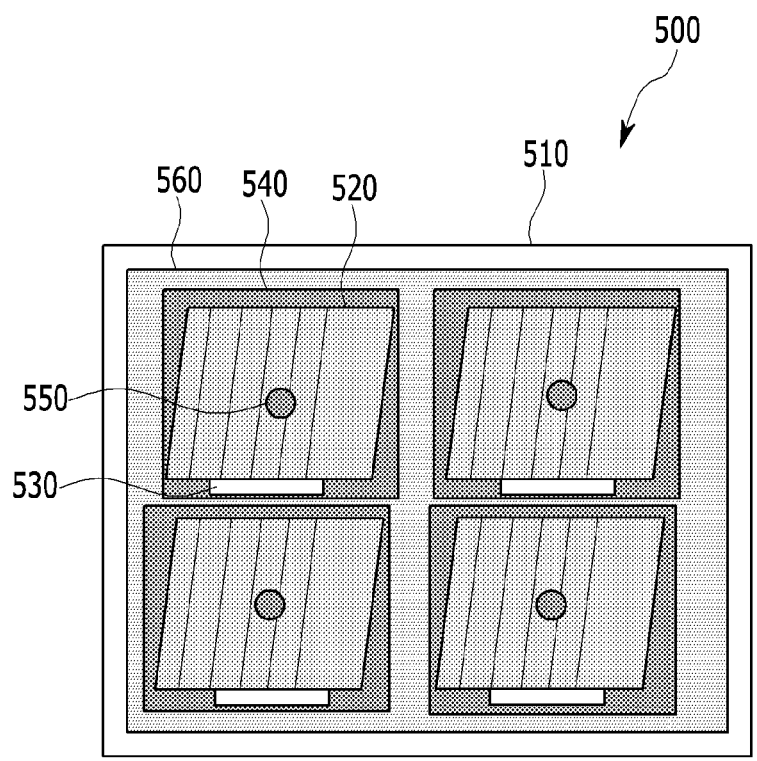
FIG. 5 is a diagram showing an example of a structure of a battery pack according to some embodiments.

FIG. 5 is a diagram showing an example of a structure of a battery pack according to some embodiments.

Referring to FIG. 5, a battery pack 500 is formed by combining a lower case 510 and an upper case (not shown), and accommodate battery modules 520 therebetween.

Although FIG. 5 shows that the battery pack 500 includes four battery modules 520 for convenience of description, the number of battery modules 520 is not limited thereto. A battery monitoring circuit 530 is connected to each battery module 520. The battery monitoring circuit 530 may monitor battery cell voltages and a temperature of the corresponding battery module 520.

A lower cover 540 may be formed under each battery module 520. The lower cover 540 may have a shape capable of collecting electrolyte leaking from the corresponding battery module 520. An electrolyte leakage detection sensor 550 may be attached to the lower cover 540. The electrolyte leakage detection sensor 550 may sense the electrolyte collected in the lower cover 540 and output a corresponding voltage.

In some embodiments, a battery pack inner cover 560 may be formed on the lower case 510. The battery pack inner cover 560 may be formed between the lower case 510 and the lower cover 540. The battery pack inner cover 560 may be formed of a non-conductor and may block a current path that may be connected with the lower case 510 by the leaked electrolyte.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery pack comprising:
   a battery module including a plurality of battery cells;
   a battery monitoring circuit connected to the battery module and configured to monitor the battery module; and
   a detection sensor configured to detect an electrolyte leaking in the battery module,
   wherein the detection sensor includes:
   a first resistor and a second resistor connected in series between a power supply supplying a first voltage and a ground terminal, and
   a variable resistor connected to the first resistor in parallel and having a resistance that varies depending on the electrolyte leaking in the battery module, and
   wherein the detection sensor is configured to transfer a sensing voltage to an input terminal of the battery monitoring circuit, the sensing voltage indicating a voltage at a node between the first resistor and the second resistor.

2. The battery pack of claim 1, wherein the battery monitoring circuit is configured to monitor the battery module while the battery monitoring circuit is in an active mode.

3. The battery pack of claim 2, further comprising:
   a pulse generator configured to generate a pulse signal for switching the battery monitoring circuit to the active mode and output the pulse signal from an output terminal of the pulse generator, in response to the sensing voltage being higher than a threshold voltage; and
   a transfer circuit configured to:
   transfer the pulse signal to a receive terminal of the battery monitoring circuit while the battery monitoring circuit is in a shutdown mode, and
   block the pulse signal from being transferred to the receive terminal of the battery monitoring circuit while the battery monitoring circuit is in the active mode.

4. The battery pack of claim 3, wherein the transfer circuit includes a transistor connected between the output terminal of the pulse generator and a ground terminal,
- wherein the transistor is configured to turn on in response to a second voltage being supplied to a power terminal of the battery monitoring circuit while the battery monitoring circuit is in the active mode, and
- wherein the transistor is configured to turn off in response to the second voltage being blocked from the power terminal of the battery monitoring circuit while the battery monitoring circuit is in the shutdown mode.

5. The battery pack of claim 4, wherein the transfer circuit further includes a diode connected between a first terminal of the transistor and the receive terminal of the battery monitoring circuit, and
- wherein a second terminal of the transistor is connected to the ground terminal.

6. The battery pack of claim 5, wherein the transfer circuit further includes a third resistor connected between the output terminal of the pulse generator and the first terminal of the transistor.

7. The battery pack of claim 1, further comprising a voltage regulator configured to generate the first voltage from a voltage of the battery module.

8. The battery pack of claim 1, wherein electrolyte leakage in the battery module is diagnosed in response to the sensing voltage being higher than a reference voltage.

9. The battery pack of claim 1, further comprising:
- a lower case of the battery pack; and
- a lower cover formed on the lower case and under the battery module, configured to collect the electrolyte leaking in the battery module, and to which the detection sensor is attached.

10. A battery apparatus comprising:
- a battery module including a plurality of battery cells;
- a battery monitoring circuit connected to the battery module and configured to monitor the battery module;
- a detection sensor configured to detect an electrolyte leaking in the battery module; and
- a battery management system configured to receive information from the battery monitoring circuit to diagnose electrolyte leakage,
- wherein the detection sensor includes a variable resistor having a resistance that varies depending on the electrolyte leaking in the battery module, and is configured to transfer a sensing voltage to an input terminal of the battery monitoring circuit, wherein the sensing voltage is determined based on the resistance of the variable resistor.

11. The battery apparatus of claim 10, wherein the battery management system is configured to diagnose that the electrolyte leaks in the battery module in response to determining that the sensing voltage is higher than a reference voltage based on the information transferred from the battery monitoring circuit.

12. The battery apparatus of claim 10, wherein the detection sensor further includes a first resistor and a second resistor connected in series between a power supply for supplying a first voltage and a ground terminal,
- wherein the variable resistor is connected to the first resistor in parallel, and
- wherein the sensing voltage is indicative of a voltage at a node between the first resistor and the second resistor.

13. The battery apparatus of claim 12, further comprising a pulse generator configured to transfer a pulse signal to a receive terminal of the battery monitoring circuit in response to the detection sensor detecting the electrolyte leaking in the battery module while the battery monitoring circuit is in a shutdown mode,
- wherein the battery monitoring circuit is configured to switch to an active mode in response to the pulse signal.

14. The battery apparatus of claim 13, wherein the pulse generator is configured to generate the pulse signal in response to the sensing voltage being higher than a threshold voltage.

15. The battery apparatus of claim 13, further comprising a transistor connected between an output terminal of the pulse generator and the ground terminal, and configured to control transfer of the pulse signal to the receive terminal of the battery monitoring circuit in response to a voltage supplied to a power terminal of the battery monitoring circuit.

16. The battery apparatus of claim 15, wherein the second voltage is supplied to the power terminal of the battery monitoring circuit while the battery monitoring circuit is in the active mode,
- wherein the second voltage is blocked from the power terminal of the battery monitoring circuit while the battery monitoring circuit is in the shutdown mode,
- wherein while the battery monitoring circuit is in the active mode, the transistor is configured to turn on to block the pulse signal from being supplied to the power terminal in response to the second voltage, and
- wherein while the battery monitoring circuit is in the shutdown mode, the transistor is configured to turn off to transfer the pulse signal in response to the blocked second voltage.

17. The battery apparatus of claim 10, further comprising a lower cover formed under the battery module, configured to collect the electrolyte leaking in the battery module, and to which the detection sensor is attached.

18. A method of detecting electrolyte leakage in a battery apparatus including a battery module, a battery monitoring circuit configured to monitor the battery module, and an electrolyte leakage detection sensor, the method comprising:
- generating, by a pulse generator, a pulse signal in response to an electrolyte leaking in the battery module while the battery monitoring circuit is in a shutdown mode;
- switching, by the battery monitoring circuit, to an active mode in response to the pulse signal;
- measuring, by the electrolyte leakage detection sensor, a sensing voltage of the electrolyte leakage detection sensor in the battery monitoring circuit while the battery monitoring circuit is in the active mode; and
- diagnosing, by a battery management system connected to the battery pack, the electrolyte leakage in response to the sensing voltage being higher than a reference voltage.

19. The method of claim 18, further comprising measuring, by the electrolyte leakage detection sensor, the sensing voltage based on a resistance that varies depending on the electrolyte leaking in the battery module.

* * * * *